US012813011B2

(12) United States Patent
Isomura et al.

(10) Patent No.: US 12,813,011 B2
(45) Date of Patent: Nov. 24, 2026

(54) SEMICONDUCTOR LIGHT RECEIVING DEVICE

(71) Applicant: Dexerials Corporation, Tochigi (JP)

(72) Inventors: Takatomo Isomura, Kyoto (JP); Etsuji Omura, Kyoto (JP)

(73) Assignee: Dexerials Corporation, Tochigi (JP)

( * ) Notice: Subject to any disclaimer, the term of this patent is extended or adjusted under 35 U.S.C. 154(b) by 419 days.

(21) Appl. No.: 18/347,565

(22) Filed: Jul. 6, 2023

(65) Prior Publication Data

US 2023/0352604 A1 Nov. 2, 2023

Related U.S. Application Data

(63) Continuation of application No. PCT/JP2021/000450, filed on Jan. 8, 2021.

(51) Int. Cl.
*H10F 77/40* (2025.01)
*H10F 30/223* (2025.01)

(52) U.S. Cl.
CPC ......... *H10F 77/413* (2025.01); *H10F 30/223* (2025.01)

(58) Field of Classification Search
CPC .... H10F 77/413; H10F 30/223; H10F 30/225; H10F 77/331
See application file for complete search history.

(56) References Cited

U.S. PATENT DOCUMENTS 5,179,430 A * 1/1993 Torikai .................. H10F 77/413 257/E31.128
5,539,221 A * 7/1996 Tsuji ................... H10F 30/2255 257/438
5,569,942 A * 10/1996 Kusakabe ........... H10F 30/2255 257/438
6,252,287 B1 * 6/2001 Kurtz .................... H10F 10/161 257/431

(Continued)

FOREIGN PATENT DOCUMENTS

JP H088456 1/1996
JP 2004031857 A * 1/2004 ............. H01L 24/32
WO 2015079763 6/2015

OTHER PUBLICATIONS

"International Search Report (Form PCT/ISA/210) of PCT/JP2021/000450", mailed on Mar. 30, 2021, with English translation thereof, pp. 1-4.

*Primary Examiner* — Bitew A Dinke
(74) *Attorney, Agent, or Firm* — JCIPRNET

(57) ABSTRACT

A semiconductor light receiving device (1A, 1B) having a semiconductor substrate (2) transparent to incident light in an infrared region for optical communications, a light receiving portion (6) with a light absorption layer (4) on a first surface (2*a*) side of the semiconductor substrate (2) to absorb the incident light, and an anti-reflection portion (11, 21) in an irradiation region (10) where incident light transmitted through the light absorption layer (4) reaches on a second surface (2*b*) side of the semiconductor substrate (2), (Continued)

the anti-reflection portion (11, 21) is formed on the second surface (2*b*) of the semiconductor substrate (2) by layering a first metal film (12) having a real part and imaginary part of a complex refractive index of 3 or more and 5 or less, respectively, a dielectric film (13) having a refractive index of 2 or less, and a second metal film (14).

4 Claims, 6 Drawing Sheets

(56) References Cited

U.S. PATENT DOCUMENTS 6,518,638 B1* 2/2003 Kuhara ............... H10F 30/2215 257/431
2002/0113282 A1* 8/2002 Yoneda ................. H10F 77/306 257/E31.128
2003/0178636 A1* 9/2003 Kwan ................. H10F 30/2215 257/190
2006/0081768 A1* 4/2006 Dutta .................... H10F 30/222 257/458
2007/0001254 A1* 1/2007 Inada .................. H10F 77/1248 257/E31.022
2007/0145420 A1* 6/2007 Okada ................... H10F 39/804 257/E31.128
2008/0212630 A1* 9/2008 Otake ................... H01S 3/0627 372/44.01
2009/0218595 A1* 9/2009 Ishimura ................ B82Y 20/00 257/E31.119
2010/0051905 A1* 3/2010 Iguchi ................. H10F 77/1248 257/E29.069
2011/0073973 A1* 3/2011 Nakaji .................. H10F 30/223 257/E31.128
2011/0241150 A1* 10/2011 Ishibashi ............. H10F 30/2255 257/E31.124
2013/0334492 A1* 12/2013 Iguchi ................... H10F 30/223 257/13
2014/0061588 A1* 3/2014 Akita ................ H01L 21/02507 257/21
2015/0228680 A1 8/2015 Lin et al.
2023/0178666 A1* 6/2023 Takemura ............. H10F 77/413 257/432

* cited by examiner

SEMICONDUCTOR LIGHT RECEIVING DEVICE

CROSS-REFERENCE TO RELATED APPLICATION

This application is a continuation of the International PCT application serial no. PCT/JP2021/000450, filed on Jan. 8, 2021, which is hereby expressly incorporated by reference, in its entirety, into the present application.

TECHNICAL FIELD

The present invention relates to a semiconductor light receiving device for receiving infrared light used for optical measurements and optical communications, and more particularly to a semiconductor light receiving device with improved fall response characteristics after receiving pulsed light.

BACKGROUND ART

Optical pulse testers (Optical time domain reflectometers: OTDRs) have been widely used for measuring loss states and defect positions in optical fiber cables used in optical communications. The optical pulse tester inputs pulsed light from one end of a laid optical fiber cable and receives backscattered light back to the input side among the Rayleigh scattered light that is generated when the pulsed light travels in the optical fiber cable. Then, a loss is measured based on the backscattered light amount (intensity), and a distance from the optical pulse tester is measured based on a time from the pulsed light input to the backscattered light reception.

At the connection point where the optical pulse tester and one end of the optical fiber cable to be measured are connected, it is inevitable that Fresnel reflection occurs when the pulsed light is incident on the optical fiber cable. Therefore, the optical pulse tester receives Fresnel reflected light at this connection point first and then receives backscattered light, when pulsed light is emitted from the optical pulse tester.

The backscattered light has very low light intensity compared to the Fresnel reflected light. Therefore, the backscattered light cannot be detected until the reception time of the Fresnel reflected light, which corresponds to the pulse width of the pulsed light, and the response time (fall time) at which a light receiving device of the optical pulse tester is ready to detect the backscattered light after reception of the Fresnel reflected light has passed. Hence, even if defects exist within the round-trip distance of light from the optical pulse tester corresponding to the time in which the backscattered light cannot be detected, there is a dead zone in which defects cannot be detected.

To reduce the dead zone, the fall time of the light receiving device should be reduced. In order to reduce the fall time of a light receiving device, a semiconductor light receiving device is known as in Patent Document #1, for example, in which light transmitted through a first light-absorption layer is absorbed by a second light-absorption layer, thereby reducing the light re-entering the first light-absorption layer. Since less light is reflected and re-enters the first light-absorption layer, its photocurrent decreases rapidly after the light has completely transmitted through the first light-absorption layer, resulting in a shorter fall time.

PRIOR ART DOCUMENTS

Patent Documents

Patent Document #1: Japanese Patent Laid-Open Publication No. 8-8456.

SUMMARY OF THE INVENTION

Problems to be Solved by the Invention

The semiconductor light receiving device of the above Patent Document #1 has the first light-absorption layer for converting incident light into an electrical signal and the second light-absorption layer for absorbing the light transmitted through the first light-absorption layer so that it does not re-enter the first light-absorption layer. This makes the device structure more complex and increases its manufacturing cost because it is necessary to form two light-absorption layers separately, which is not easy to form for crystal growth.

An object of the present invention is to provide a semiconductor light receiving device with a simple structure that prevents re-entering of light transmitted through a light-absorption layer.

Means to Solve the Problems

The present invention presents a semiconductor light receiving device comprising a semiconductor substrate transparent to incident light in an infrared region for optical communications and a light receiving portion having a light absorption layer for absorbing the incident light formed on a first surface side of the semiconductor substrate to; wherein an anti-reflection portion is provided in an irradiation region where incident light that enters the light receiving portion from the first surface side and transmitted through the light absorption layer reaches, on a side of a second surface opposite to a first surface of the semiconductor substrate, the anti-reflection portion is formed on the second surface of the semiconductor substrate by layering a first metal film having a real part and an imaginary part of a complex refractive index each of which is 3 or more and 5 or less respectively, a dielectric film having a refractive index of 2 or less, and a second metal film.

According to the above configuration, the light receiving portion of the semiconductor light receiving device, which has the light absorption layer, receives light in the infrared region used for optical communications. And the anti-reflection portion is provided in the irradiation region where light transmitted through the light absorption layer reaches. The anti-reflection portion is formed by layering the first metal film having the complex refractive index within the above range, the dielectric film having the refractive index of 2 or less, and the second metal film. Therefore, the reflection of light transmitted through the light absorption layer can be prevented by the anti-reflection portion, so that re-entering the light receiving portion of the reflected light can be prevented with a simple structure. Hence, the fall time of the semiconductor light receiving device is reduced.

In a first preferable aspect of the present invention, a third metal film having a real part and an imaginary part of a complex refractive index each of which is 3 or more and 5 or less, respectively, and thinner than the first metal film is provided between the dielectric film and the second metal film.

According to the above configuration, it is possible to prevent the reflected light from re-entering the light receiving portion again with a simple structure, and the third metal film can improve an adhesion between the dielectric film and the second metal film. Therefore, it is possible to prevent the reflective function of the anti-reflection portion from degradation due to gaps formed by delamination of the dielectric film and the second metal film.

In a second preferable aspect of the present invention, the first metal film is mainly composed of one element selected from titanium, chromium, and tungsten.

According to the above configuration, it is possible to form the anti-reflection portion having a low reflectance of incident light in the infrared region for optical communications.

In a third preferable aspect of the present invention, the second metal film is mainly composed of gold.

According to the above configuration, the anti-reflection portion can also be used as one electrode of the semiconductor light receiving device, so that the semiconductor light receiving device with a simple structure can be formed.

Advantages of the Invention

According to the semiconductor light receiving device of the present invention, reflection can be prevented with a simple structure so that light transmitted through the light absorption layer is not incident the light absorption layer again.

DESCRIPTION OF EMBODIMENTS

Best mode for implementing the present invention will now be explained on basis of embodiments.

First Embodiment

Figure 1:
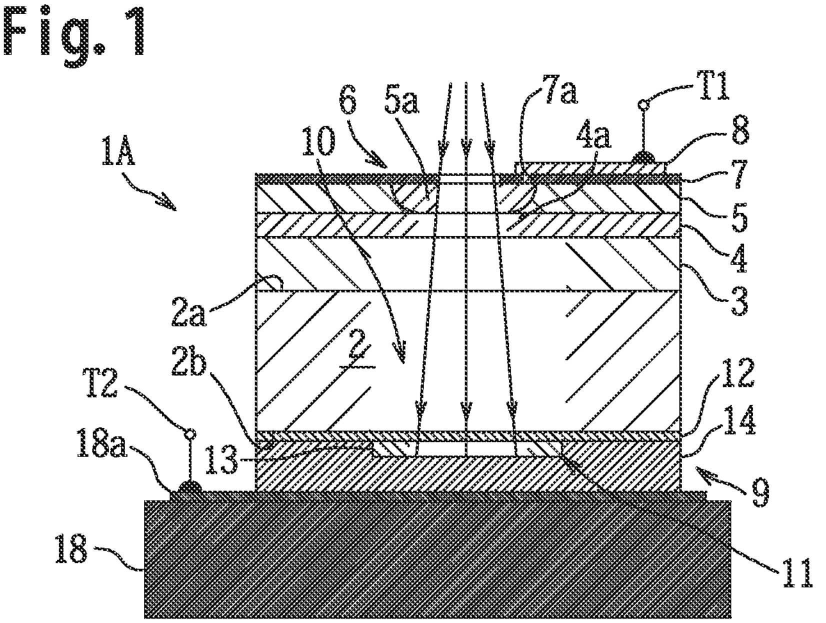
FIG. 1 is a cross-sectional view showing a structure of a semiconductor light receiving device according to a first embodiment of the present invention.

A semiconductor light receiving device 1A includes, for example, a PIN photodiode or an avalanche photodiode for receiving incident light in an infrared light region (wavelength λ in a range of 1100 to 1600 nm) for optical communications. Here, an example of the semiconductor light receiving device 1A having a PIN photodiode as shown in FIG. 1 will be described.

The semiconductor light receiving device 1A comprises an n-InP layer as a first semiconductor layer 3, an InGaAs layer as a light absorption layer 4 that absorbs incident light, and an n-InP layer as a second semiconductor layer 5 on a first surface 2*a* side of an n-InP substrate for example as a semiconductor substrate 2 transparent to incident light in the infrared light region for optical communications. The second semiconductor layer 5 has a p-type diffusion region 5*a* that is selectively doped with Zn, for example. A region of the light absorption layer 4 in contact with the p-type diffusion region 5*a* corresponds to a light absorption region 4*a*. Then, the p-type diffusion region 5*a*, the light absorption region 4*a*, and the first semiconductor layer 3 form a photodiode (light receiving portion 6). The thicknesses of first and second semiconductor layers 3 and 5 and the light absorption layer 4 are appropriately set, and are formed to be a thickness of 1 to 5 μm, for example.

A surface of the second semiconductor layer 5 is covered with a protective film 7 (eg, SiN film, SiO2 film, etc.) having an opening 7*a* communicating with the p-type diffusion region 5*a*. An anode electrode 8 connected to the p-type diffusion region 5*a* from the opening 7*a* is formed. The size and shape of the p-type diffusion region 5*a* are appropriately set, and are formed in a circular shape with a diameter of 10 to 200 μm, for example.

On a second surface 2*b* side opposite the first surface 2*a* of the semiconductor substrate 2, an anti-reflection portion 11 is provided in an irradiation region 10 where the incident light incident on the light receiving portion 6 so as to incident from the first surface 2*a* side to the semiconductor substrate 2 and transmitted through the light absorption layer 4 (light absorption region 4*a*) reaches. The anti-reflection portion 11 is designed to prevent incident light transmitted through the light absorption layer 4 (light absorption region 4*a*) from being reflected and entering the light receiving portion 6 again.

The anti-reflection portion 11 is formed by layering a first metal film 12, a dielectric film 13, and a second metal film 14 on the second surface 2*b* side of the semiconductor substrate 2. The first metal film 12 is, for example, a titanium film (Ti film) having a thickness of 30 nm formed by vapor deposition. The dielectric film 13 is a silicon oxide film (SiO2 film) having a thickness of 300 nm formed by chemical vapor deposition, for example, and is selectively formed so as to cover the irradiation region 10. The second metal film 14 is, for example, a gold film (Au film) hawing a thickness of 600 nm formed by vapor deposition.

The first metal film 12 is connected to the semiconductor substrate 2 and to the second metal film 14 outside the anti-reflection portion 11. Then, a cathode electrode 9 is formed by the first metal film 12 and the second metal film 14. The cathode electrode 9 is connected and fixed to a wiring 18*a* formed on a mounting substrate 18 by, for example, conductive paste (not shown). Also, the anode electrode 8 is connected by bonding wire, for example, to another wiring formed on the mounting substrate 18, which is not shown. A photocurrent generated in the light receiving portion 6 is taken out to the outside from the terminal portions T1 and T2 of these wirings.

In order to reduce a fall time of the semiconductor light receiving device 1A, it is necessary to prevent the incident light transmitted through the light absorption region 4*a* from being reflected and re-entering the light absorption region 4*a*. Therefore, reflectance of the anti-reflection portion 11 formed in the irradiation region 10 is preferable as low as possible, and is required to be, for example, 1% or less.

Figure 2:
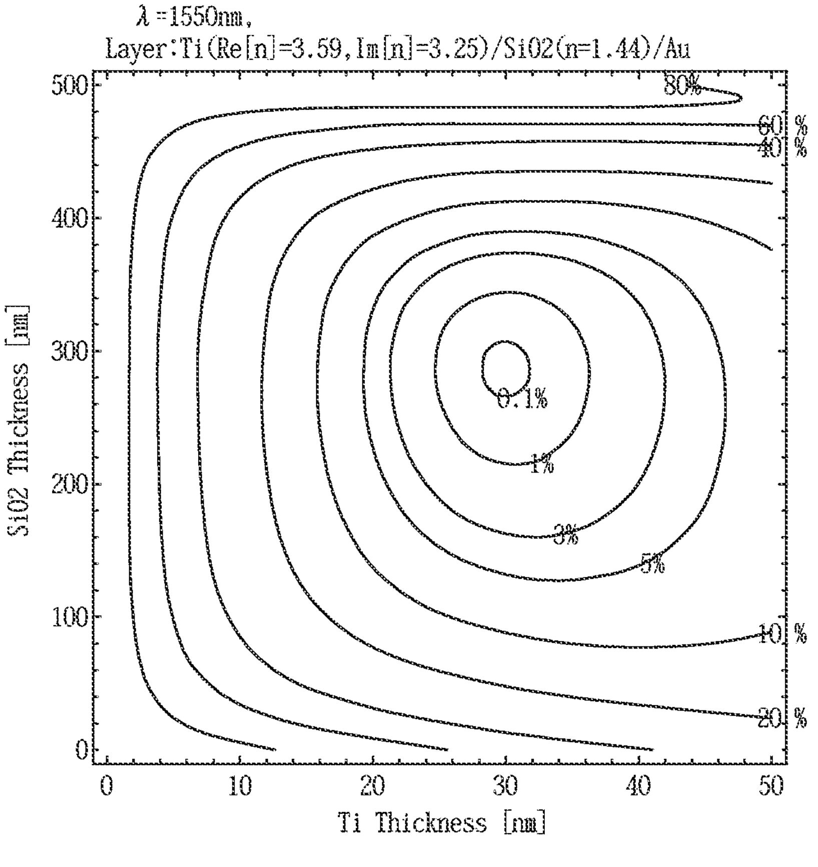
FIG. 2 is a diagram showing reflectance when the first metal film of the anti-reflection portion is a Ti film according to the first embodiment.

FIG. 2 shows a contour plot of reflectance simulation results of the anti-reflection portion 11 of the semiconductor light receiving device 1A for infrared light with a wavelength λ of 1550 nm, when thicknesses of the Ti film as the first metal film 12 and the SiO2 film as the dielectric film 13 are both set as parameters. When the thickness of the Ti film is approximately 30 nm and the thickness of the SiO2 film is approximately 300 nm, the reflectance is approximately 0.1%, so the anti-reflection portion 11 with low reflectance s formed. In addition, when the thickness of the Ti film is 26 to 35 nm and the thickness of the SiO2 film is 220 to 340 nm, the reflectance is approximately less than 1%, which means that a wide range of acceptable film thicknesses can be used to stably form the anti-reflection portion 11 with low reflectance.

For infrared light with a wavelength λ in the range of 1100-1600 nm for optical communications, the Ti film has a real part (Re[n]) of 3.4-3.6 and an imaginary part (Im[n]) of 3.4-3.6 of the complex refractive index n. The SiO2 film has a refractive index of 1.45 to 1.44 for infrared light in this wavelength range.

In some cases, metal materials other than Ti film may be preferred as the first metal film 12. Therefore, in order to identify the first metal film 12 that can form the anti-reflection portion 11 with low reflectance, the inventors performed simulations of reflectance as in FIG. 2 using the Re[n] and the Im[n] of the first metal film 12 as parameters. As the result, the ranges of the Re[n] and the Im[n] of the first metal film 12, which have a wide range of acceptable film thicknesses and can stably form the anti-reflection portion 11 with low reflectance, were identified.

Figure 3:
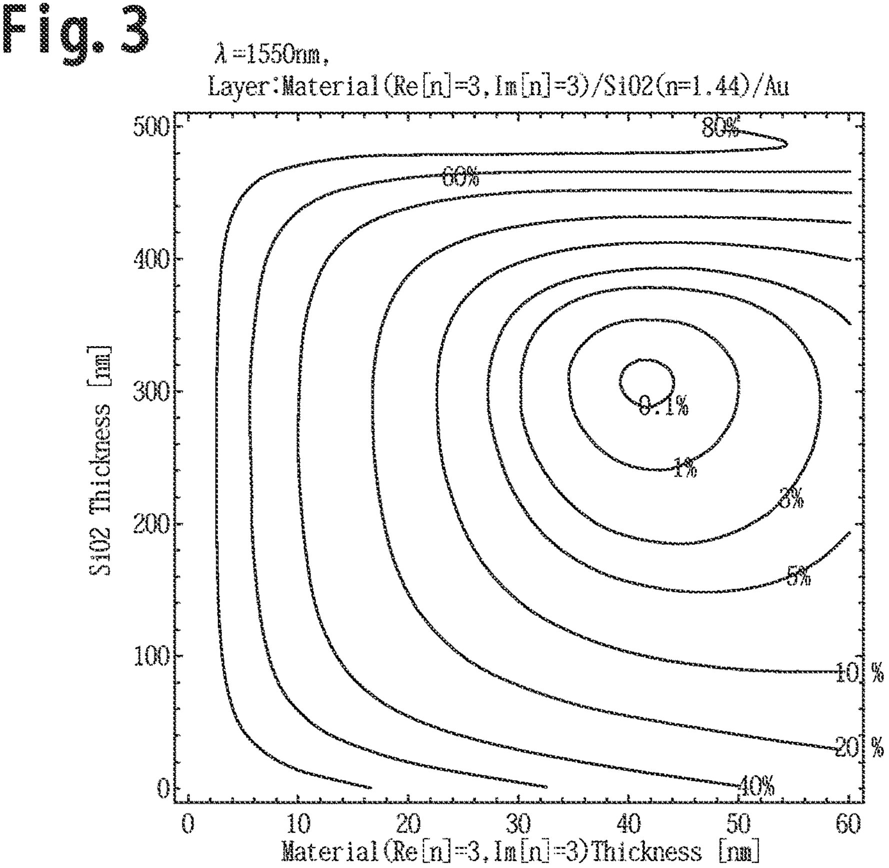
FIG. 3 is a diagram showing reflectance at a lower limit value of the complex refractive index of the first metal film of the anti-reflection portion.
Figure 4:
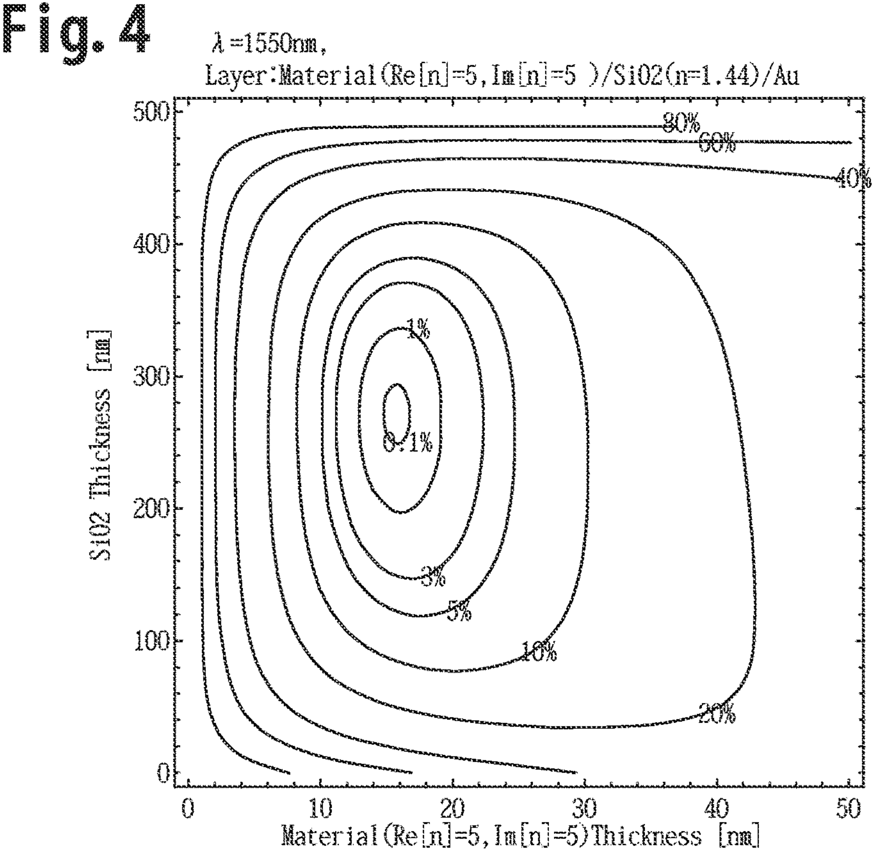
FIG. 4 is a diagram showing reflectance at a upper limit value of the complex refractive index of the first metal film of the anti-reflection portion.

FIG. 3 shows a contour plot of the reflectance of the anti reflection portion 11 when the Re [n] is 3 and the Im [n] is 3 of the first metal film 12. FIG. 4 shows a contour plot of the reflectance of the anti-reflection portion 11 when the Re [n] is 5 and the Im [n] is 5 of the first metal film 12.

Although the thickness range of the first metal film 12 and the thickness range of the SiO2 film as the dielectric film 13, which have low reflectance, are different from FIG. 2, in both of FIG. 3 and FIG. 4, there is a wide range of acceptable film thicknesses in which the reflectance is approximately 1% or less, and the anti-reflection portion 11 with low reflectance can be formed stably. Although the figure is omitted, if the Re [n] is 3 to 5 and the Im [n] is 3 to 5 of the first metal film 12, there is a wide range of film thicknesses in which the reflectance can be reduced to 1% or less, and the anti-reflection portion 11 with low reflectance can be formed stably.

From the above simulations, it was found that the anti-reflection portion 11 having low reflectance can be obtained when the first metal film 12 of the anti-reflection portion 11 is a metal film using a metal material in which the Re[n] and the Im[n] of the complex refractive index n are respectively 3 or more as the lower limit and 5 or less as the upper limit. Next, FIG. 5 shows the results of the simulation of metal materials with the Re[n] and the Im[n] of the complex refractive index n are 3 or more and 5 or less respectively for infrared light in the wavelength range of 1100 to 1600 nm for optical communications.

Figure 5:
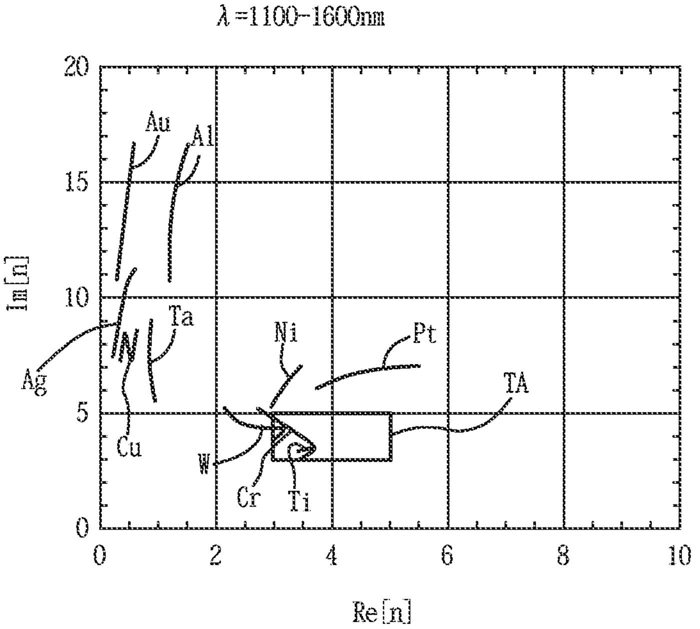
FIG. 5 is a diagram showing the complex refractive index of metal materials with respect to light in the infrared region for optical communications.

FIG. 5 shows the complex refractive indices of various metal materials for infrared light with a wavelength λ in the range of 1100 to 1600 nm. An area where the Re[n] and the Im[n] of the complex refractive index n are 3 or more and 5 or less, respectively, is shown as a target area TA. In the case of Ti, infrared light with a wavelength λ of 1100 to 1600 nm is within the target area TA. In the case of Chromium (Cr), infrared light with a wavelength λ of 1100 to 1580 nm is within the target area TA. In the case of tungsten (W), infrared light with a wavelength λ of 1100 to 1450 nm is within the target area TA.

Figure 6:
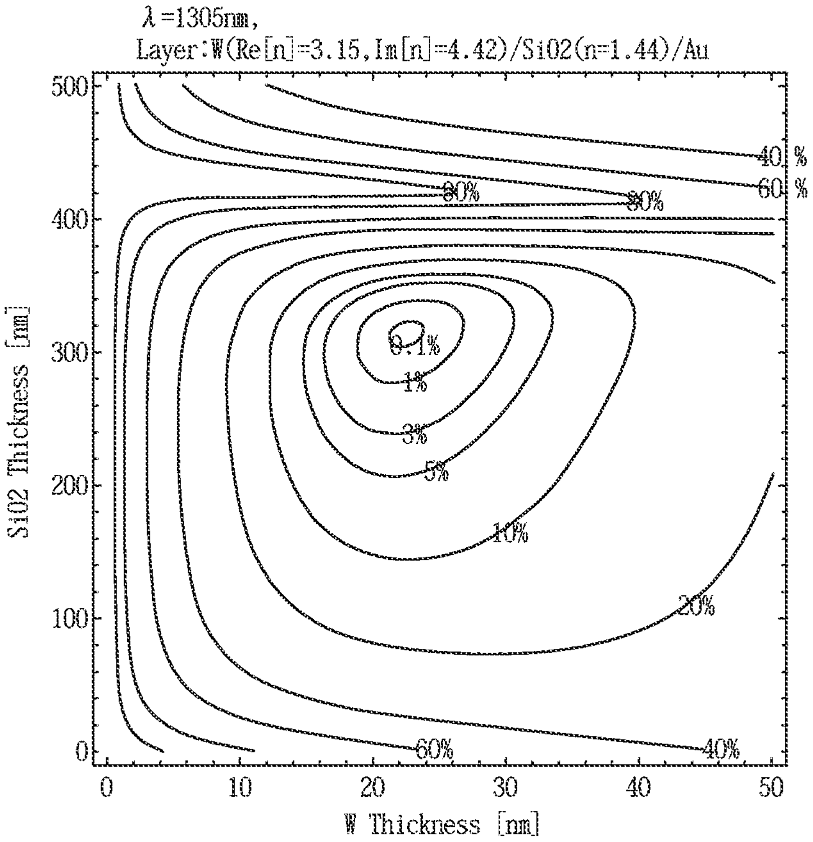
FIG. 6 is a diagram showing reflectance when the first metal film of the anti-reflection portion is a W film according to the first embodiment.

FIG. 6 shows the reflectance for infrared light with a wavelength λ of 1305 nm when the first metal film 12 is a W film. When the film thickness of the W film is approximately 22+/−4 nm and the film thickness of the SiO2 film as the dielectric film 13 is approximately 310+/−30 nm, the anti-reflection portion 11 with low reflectance can be formed. Although the figure is omitted, the anti-reflection portion 11 having a low reflectance can be similarly formed when the first metal film 12 is a Cr film.

Figure 7:
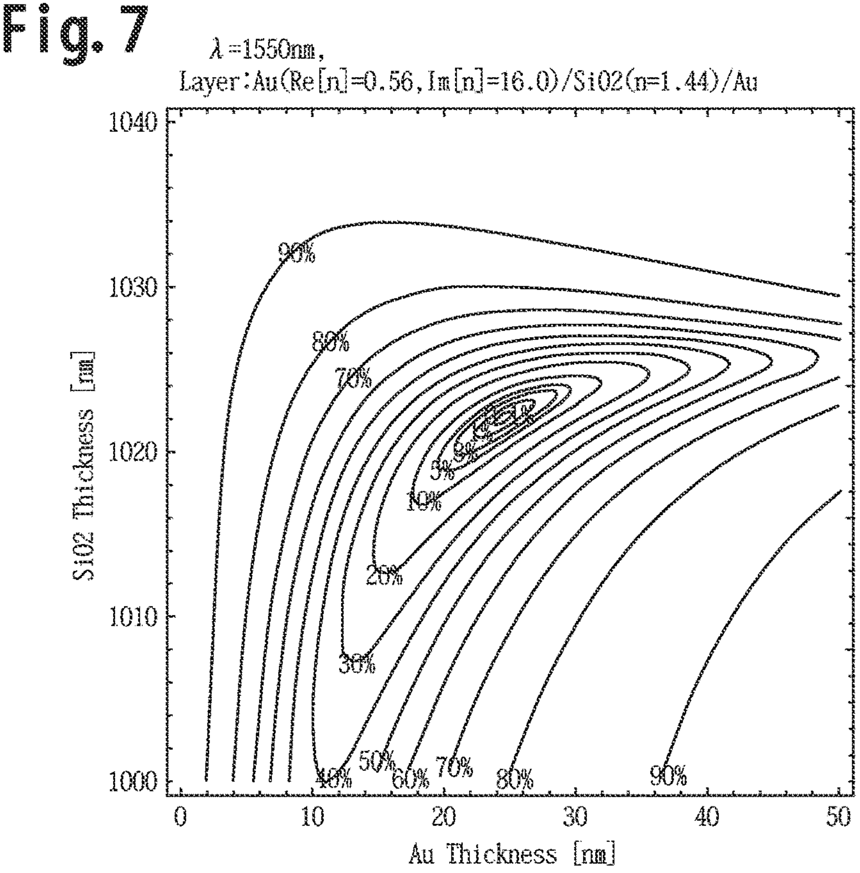
FIG. 7 is a diagram showing reflectance when the first metal film of the anti-reflection portion is an Au film according to the first embodiment.
Figure 8:
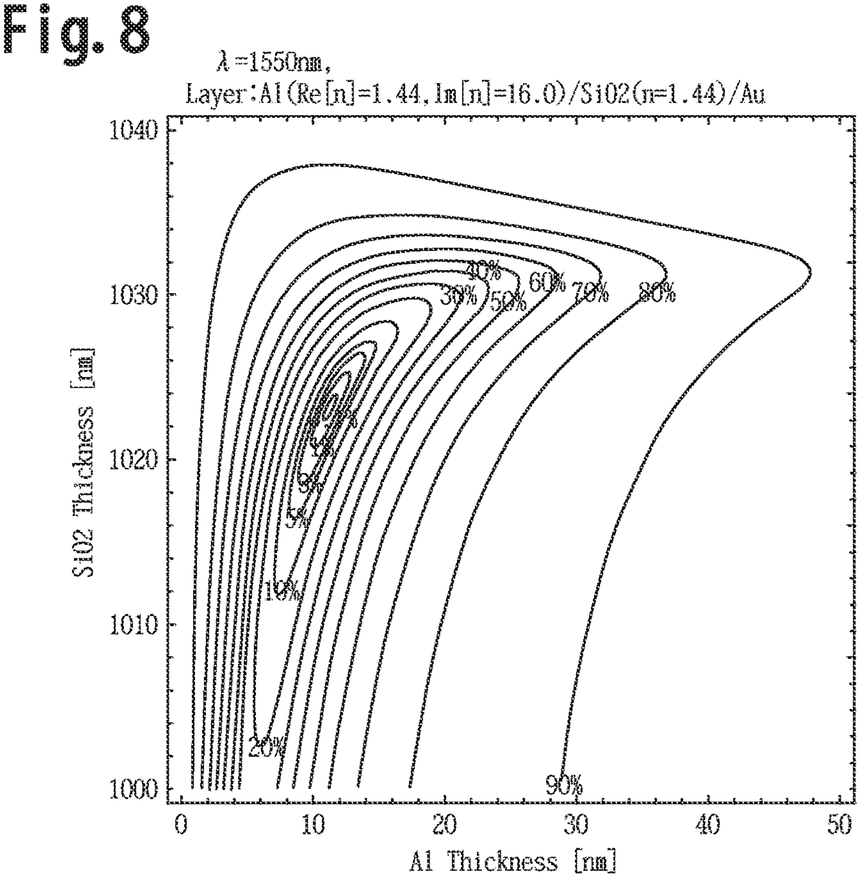
FIG. 8 is a diagram showing reflectance when the first metal film of the anti-reflection portion is an Al film according to the first embodiment.

Outside the target area TA in FIG. 5, the complex refractive indices of metal materials other than Ti, Cr and W are plotted. For infrared light with a wavelength λ of 1550 nm, when the first metal film 12 is a gold film (Au film) as shown in FIG. 7, the first metal film 12 is an aluminum film (Al film) as shown in FIG. 8, the range of film thickness of the SiO2 film with low reflectance is narrower than that of the metal materials in the target area TA. Also, the combination of the thickness of the SiO2 film and the thickness of the Au film greatly affects the reflectance.

Therefore, it is required to precisely control the thicknesses of the dielectric film 13 and the first metal film 12 of the metal material outside the target area TA, so that it is more difficult to form the anti-reflection portion 11 with low reflectance stably than using the metal materials within the target area TA. In addition, when the first metal film 12 is an Al film, the thickness of this film is approximately 10 nm to achieve low reflectance, but its thinness compared to the metal materials within the target area TA is another factor that makes it difficult to form stably anti-reflection portion 11 with low reflectance.

Figure 9:
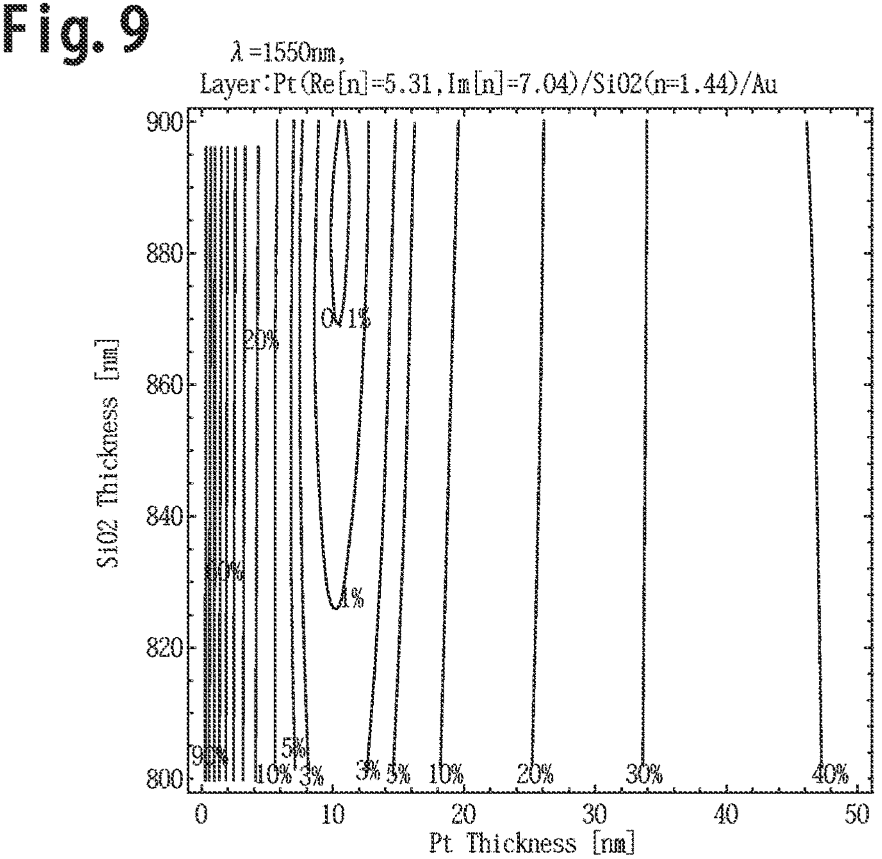
FIG. 9 is a diagram showing reflectance when the first metal film of the anti-reflection portion is a Pt film according to the first embodiment.

When the first metal film 12 is a platinum film (Pt film) as shown in FIG. 9, low reflectance is achieved when the thickness of the Pt film is approximately 10 nm. However, compared to the metal materials within the target area TA, the film thickness is thin and the allowable film thickness range is as narrow as +/−2 nm, making it difficult to stably form an anti-reflection portion 11 with low reflectance.

Figure 10:
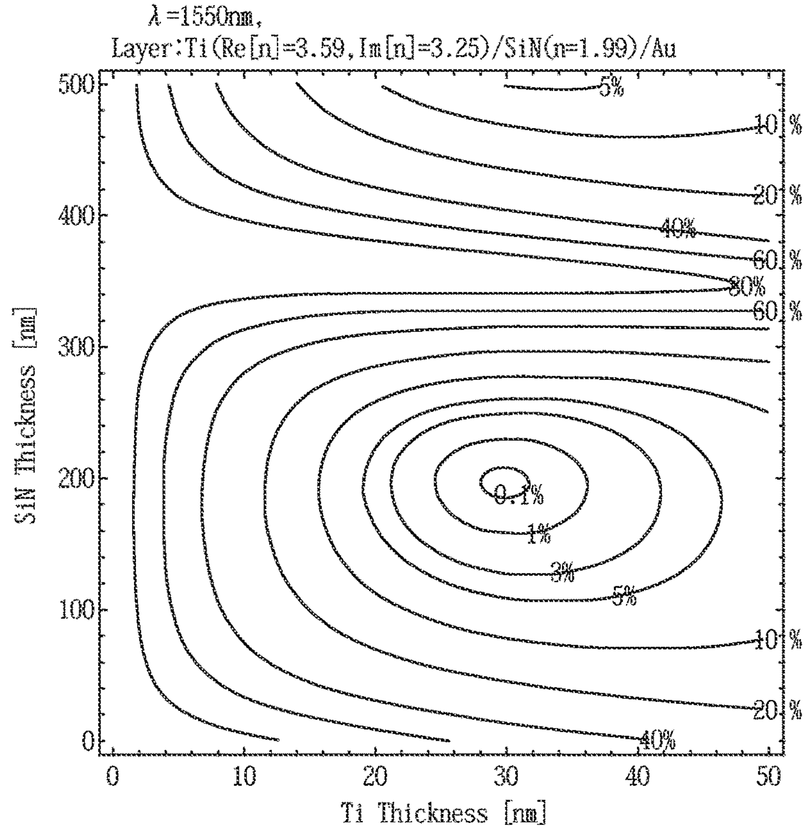
FIG. 10 is a diagram showing reflectance when the dielectric film of the anti-reflection portion is a SiN film according to the first embodiment.

The dielectric film 13 of the anti-reflection portion 11 may be a SiN film as well as the SiO2 film. The refractive index of the SiN film is approximately 1.99, which is greater than the refractive index of 1.44 of the SiO2 film. Even in this case, for example, as shown in FIG. 10, the anti-reflection portion 11 with reflectance of 1% or less is formed when the Ti film thickness is +/−5 nm and the SiN film thickness is 195+/−30 nm. Since there is a wide range of acceptable film thicknesses in which the reflectance is approximately 1% or less, the anti-reflection portion 11 with low reflectance can be stably formed.

Second Embodiment

A semiconductor light receiving device 1B obtained by partially modifying the first embodiment will be described. Parts equivalent to those of the first embodiment are denoted by the same reference numerals as those of the first embodiment, and descriptions thereof are omitted.

Figure 11:
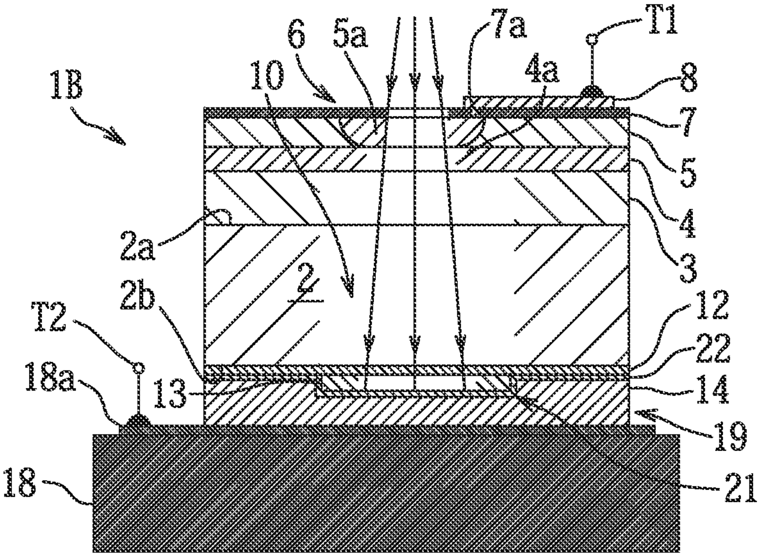
FIG. 11 is a cross-sectional view showing a structure of a semiconductor light receiving element according to a second embodiment of the present invention.

As shown in FIG. 11, the semiconductor light receiving device 1B includes the first semiconductor layer 3, the light absorption layer 4, and the second semiconductor layer 5 on the first surface 2*a* side of the semiconductor substrate 2, which is transparent to incident light in the infrared region for optical communications. The second semiconductor layer 5 has a p-type diffusion region 5*a*. The region of the light absorption layer 4 in contact with the p-type diffusion region 5*a* corresponds to the light absorption region 4*a*, and the photodiode (light receiving portion 6) is formed by the p-type diffusion region 5*a*, the light absorption region 4*a* and the first semiconductor layer 3.

On the second surface 2*b* side of the semiconductor substrate 2, an anti-reflection portion 21 is provided in the irradiation region 10 where the incident light incident on the light receiving portion 6 from the first surface 2*a* side and transmitted through the light absorption layer 4 (light absorption region 4*a*) reaches. The anti-reflection portion 21 is designed to prevent incident light transmitted through the light absorption layer 4 (light absorbing region 4*a*) from being reflected and re-entering the light receiving portion 6.

The anti-reflection portion 21 has the first metal film 12, the dielectric film 13, the second metal film 14, and a third metal film 22. The first metal film 12 is, for example, a Ti film with a thickness of 27 nm. The dielectric film 13 is, for example, an SiO2 film with a thickness of 270 nm, and is selectively formed in the irradiation region 10. The second metal film 14 is, for example, an Au film with a thickness of 600 nm. The third metal film 22 is, for example, a Ti film with a thickness of 3 nm which is formed after the formation of the dielectric film 13 and before the formation of the second metal film 14 to improve the adhesion between the dielectric film 13 and the second metal film 14. This third metal film 22 may be selectively formed in the same region as the dielectric film 13.

The first metal film 12 is connected to the semiconductor substrate 2, and to the second metal film 14 via the third metal film 22 outside the anti-reflection portion 21, and a cathode electrode 19 is formed by the first metal film 12, third metal film 22 and second metal film 14. The cathode electrode 19 is connected and fixed to the wiling 18*a* formed on the mounting substrate 18 by, for example, a conductive paste (not shown). Also, the anode electrode 8 is connected by bonding wire, for example, to another wiring (not shown) formed on the mounting substrate 18. Then, the photocurrent generated in the light receiving portion 6 is taken out to the outside from the terminal portions T1 and T2 of these wirings.

Figure 12:
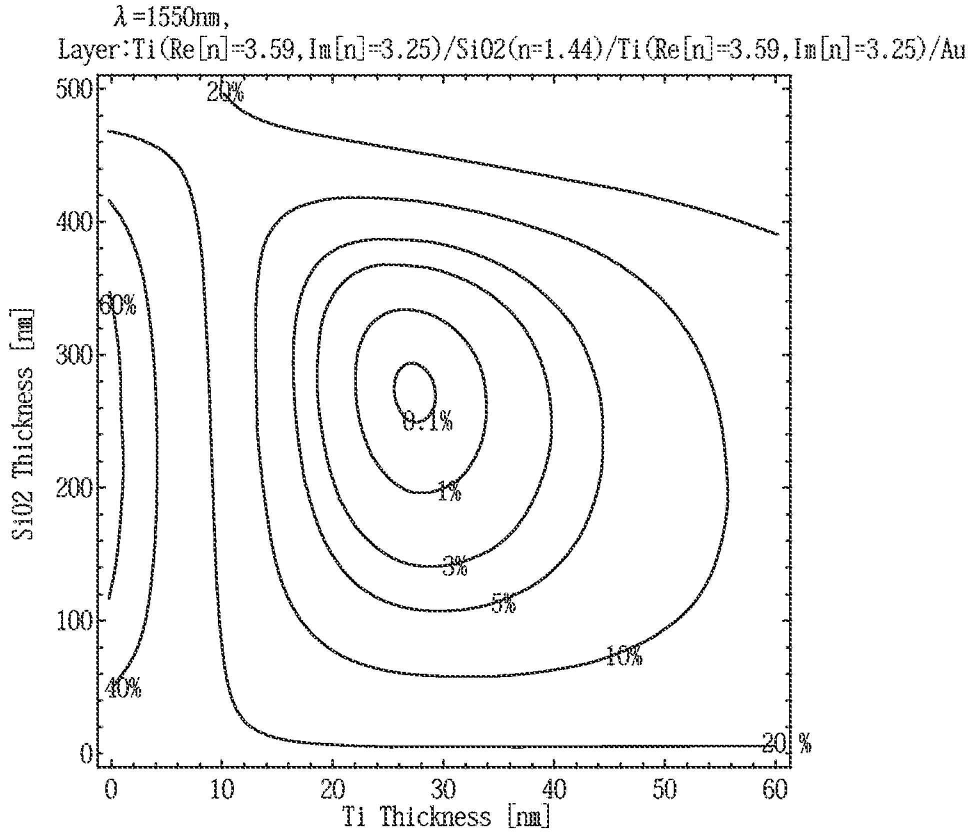
FIG. 12 is a diagram showing reflectance when the first and third metal films of the anti-reflection portion are Ti films according to the second embodiment.

FIG. 12 shows a contour plot of reflectance simulation results of the anti-reflection portion 21 of the semiconductor light receiving device 1B for infrared light with a wavelength $\lambda$ of 1550 nm, when the thicknesses of the Ti film as the first metal film 12 and the SiO2 film as the dielectric film 13 are both set as parameters. When the thickness of the Ti film is approximately 27 nm and the thickness of the SiO2 film is approximately 270 nm, the reflectance is approximately 0.1%, and the anti-reflection portion 21 having a very low reflectance is formed. In addition, when the thickness of the Ti film is within the range of 22 to 34 nm and the thickness of the SiO2 film is within the range of 200 to 330 nm, the reflectance is approximately 1% or less, which means that a wide range of acceptable film thicknesses can be used to stably form an anti-reflection portion 21 with low reflectance.

Actions and effects of the semiconductor light receiving device 1A and 1B will be described.

The light receiving portion 6 having light absorption layer 4 of semiconductor light receiving device 1A, 1B receives light in a wavelength range ($\lambda$=1100 to 1600 nm) used for optical communications. Then, the irradiation region 10, where light transmitted through the light-absorption layer 4 (light-absorption region 4*a*) reaches, is provided with anti-reflection portion 11, 21 formed by layering the first metal film 12 with the complex refractive index n within the specific range where the real part (Re [n]) and the imaginary part (Im [n]) are respectively 3 or more and 5 or less, the dielectric film 13 with the refractive index of 2 or less, and the second metal film 14.

Therefore, the reflection of light transmitted through the light absorption region 4*a* of the light absorption layer 4 can be prevented by the anti-reflection portion 11, 21, so that re-entering the light receiving portion 6 of the reflected light can be prevented with a simple structure. Hence, the fall time of the semiconductor light receiving device 1A, 1B is reduced.

The semiconductor light receiving device 1B also has the third metal film 22 between the dielectric film 13 and the second metal film 14. The third metal film 22 is thinner than the first metal film 12, and both the real part (Re[n]) and the imaginary part (Im[n]) of the complex refractive index n are 3 or more and 5 or less, respectively. In this configuration, the third metal film 22 can improve the adhesion between the dielectric film 13 and the second metal film 14. Therefore, it is possible to prevent degradation of the reflective function of the anti-reflection portion 21 due to gaps formed by delamination of the dielectric film 13 and the second metal film 14.

The first metal film 12 is mainly composed of one element selected from titanium, chromium and tungsten. Titanium, chromium, and tungsten have the real part (Re[n]) and the imaginary part (Im[n]) of the complex refractive index n of 3 or more and 5 or less, respectively, for light in the wavelength range for optical communications. Therefore, the anti-reflection portion 11, 21 can be formed with low reflectance for incident light in the wavelength range for optical communications.

The second metal film 14 is an Au film containing gold as its main component. In this configuration, the anti-reflection portion 11, 21 can also be used as one electrode (cathode electrode 9, 19) of the semiconductor light receiving device 1A, 1B. Therefore, it is possible to form the semiconductor light receiving device 1A, 1B with a simple structure.

In addition, those skilled in the art can implement various modifications to the above embodiment without departing from the scope of the present invention, and the present invention includes such modifications.

DESCRIPTION OF REFERENCE NUMERALS

1A, 1B: semiconductor light receiving device
2: semiconductor substrate
2*a*: first surface
2*b*: second surface

3: first semiconductor layer
4: light-absorption layer
4*a*: light-absorption region
5: second semiconductor layer
5*a*: p-type diffusion region
6: light-sensitive portion
7: protective film
7*a*: opening
8: anode electrode
9, 19: cathode electrode
10: irradiation region
11, 21: anti-reflection portion
12: first metal film
13: dielectric film
14: second metal film
18: mounting substrate
18*a*: wiring
22: third metal film
T1, T2: terminal portion

The invention claimed is:

1. A semiconductor light receiving device comprising a semiconductor substrate having a first and second surfaces opposite each other transparent to incident light in an infrared region for optical communications and a light receiving portion having a light absorption layer for absorbing the incident light formed on the first surface of the semiconductor substrate; wherein an anti-reflection portion is provided on the second surface of the semiconductor substrate in an irradiation region where incident light that enters the light receiving portion from the first surface side and transmitted through the light absorption layer reaches, the anti-reflection portion is formed by layering a first metal film having a real part and an imaginary part of a complex refractive index each of which is 3 or more and 5 or less respectively, a dielectric film having a refractive index of 2 or less, and a second metal film.

2. The semiconductor light receiving device according to claim 1; wherein a third metal film having a real part and an imaginary part of a complex refractive index each of which is 3 or more and 5 or less respectively, and thinner than the first metal film is provided between the dielectric film and the second metal film.

3. The semiconductor light receiving device according to claim 1; wherein the first metal film is mainly composed of one element selected from titanium, chromium, and tungsten.

4. The semiconductor light receiving device according to claim 1; wherein the second metal film is mainly composed of gold.

* * * * *